United States Patent [19]

Stern

[11] Patent Number: 4,994,669

[45] Date of Patent: Feb. 19, 1991

[54] OPTO-ELECTRICAL JOYSTICK SWITCH HAVING A RESILIENT, RIGIDLY MOUNTED CENTRAL SHAFT

[76] Inventor: Michael A. Stern, 1010 N. Maclay Ave., San Fernando, Calif. 91340

[21] Appl. No.: 543,859

[86] PCT Pub. No. PCTUS89/00584
§ 371 Date: Jul. 29, 1990
§ 102(e) Date: Jul. 29, 1990

[22] PCT Filed: Feb. 14, 1989

[51] Int. Cl.⁵ ............................................. G01D 5/34
[52] U.S. Cl. .................................. 250/229; 250/221; 273/148 B
[58] Field of Search ................... 250/221, 229, 211 K; 340/709; 273/148 B

[56] References Cited

U.S. PATENT DOCUMENTS 4,856,785  8/1989  Lantz et al. .......................... 250/221
4,879,556  11/1989  Duimel ................................ 340/709

Primary Examiner—David C. Nelms
Assistant Examiner—Khaled Shami
Attorney, Agent, or Firm—Albert O. Cota

[57] ABSTRACT

An opto-electrical joystick switch having a hollow cylindrical (20) housing with a collared top (26) and a separated bottom (28). A resilient joystick shaft (36) is rigidly mounted onto the housing bottom and penetrates through an opening at the top of the collar. A pair of printed circuit boards (46) and (50) are juxtapositioned within the housing, each having at least four light emitting diodes (48) and opposed light sensing photodiodes (52) in communication with each other through a light beam. A light blocking commutator disc (54) is disposed upon the shaft between the boards such that when the shaft is manually forced in a given direction, the light is interrupted from the diodes. An external or optional internal power source energizes the diodes and provides a basis for an electronic circuit that processes a signal created by the blocked diodes when the 8-position switch is displaced from its neutral position.

15 Claims, 3 Drawing Sheets

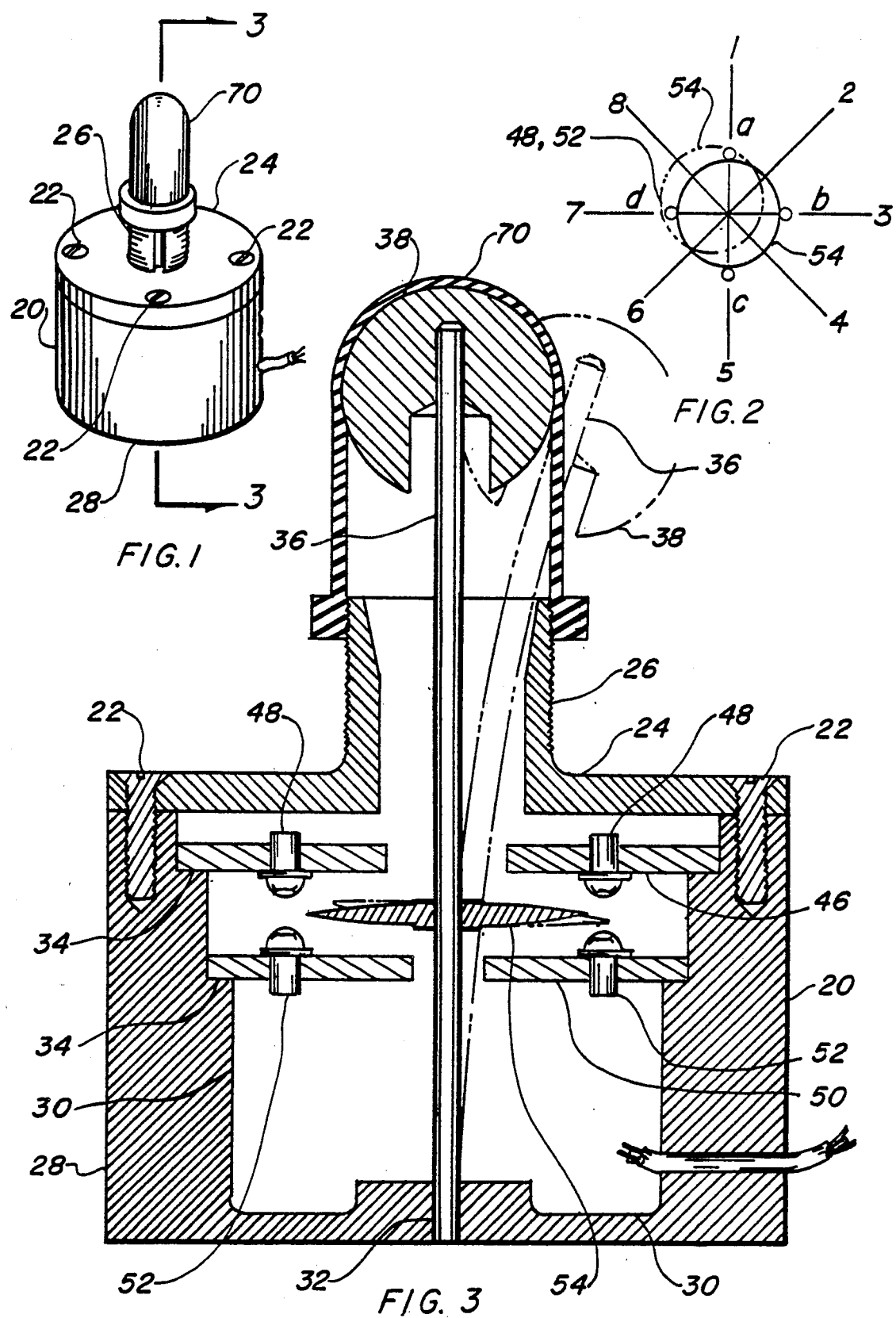

OPTO-ELECTRICAL JOYSTICK SWITCH HAVING A RESILIENT, RIGIDLY MOUNTED CENTRAL SHAFT

TECHNICAL FIELD

The present invention relates to switches using joysticks for actuation in general, and more particularly to photo-electric actuated switches having solid state signal processing.

BACKGROUND ART

Previously, many types of switches utilizing various actuation techniques have been in use. The photo-electric joystick switch has replaced its mechanical counterpart in applications that require high reliability, as they do not have electrical contacts that frequently burn out, as with the mechanical switches. However, thus far little work has been done to further improve the performance and longevity of the photo-electric joystick switch. Thus, the mechanical components wear out and have now become the weak link that causes failures.

This invention is of a low-cost, 8-position photo-electric joystick switch, that is versatile, durable and highly reliable, with a life expectancy that can exceed the life of the product it will become a part of.

A search of the prior art did not disclose any patents that read directly on the claims of the instant invention, however, the following U.S. Pat. Nos. were considered related:

| U.S. Pat. No. | Inventor | Issue Date |
| --- | --- | --- |
| 4,748,323 | Holiday | May 31, 1988 |
| 4,607,159 | Goodson et al | Aug. 19, 1986 |
| 4,533,827 | Fincher | Aug. 6, 1985 |
| 4,459,022 | Morey | Jul. 10, 1984 |
| 4,250,378 | Mutton | Feb. 10, 1981 |

Holiday uses a control shaft extending through a donut shaped, flexible, shaft-supporting mount in a narrower neck portion of a hollow casing. The shaft tilts about a vertical axis from a neutral position with the mount being relied upon for repeatability and longevity. While the mount is flexible, and no other description is given, it is obviously limited in its life and questionable as to its ability to recenter after much use. A single circuit board is taught with C-shaped support members under the board to attach the mating light detector.

Goodson et al utilize the control stick as a shutter to regulate the light falling onto the light detectors to produce control signals indicative of control stick positions. A pivot ball in a socket retains the control stick and four leaf springs engage the lowermost end of the stick to restore the stick to the centered position.

Fincher discloses a switch varying voltage through the use of a plurality of partial spheres mounted on a joystick shaft having variable light detectable surfaces. The control shaft is mounted in a ball joint with a support structure connected to a base.

Morey utilizes the angular orientation of the handle with light emitted from an optical fiber reflected from a concave mirror mounted on the handle and intercepted by a plurality of optical fibers. The intensity of light intercepted by these fibers measures the angle of the handle.

For background purposes and as indicative of the art to which the invention relates, reference may be made to the remaining U.S. Pat. No. 4,250,378 issue to Mutton.

DISCLOSURE OF THE INVENTION

Joystick switches are used in many applications including electronic games, aircraft, computers and the like. The instant invention has proven successful due to its small compact size and simplicity. It is, therefore, a primary object of the invention to provide a switch that functions as a modular component to be used as an integral part of a joystick assembly. Housings or structure may be added to fit the particular application with a simple hole and nut, the only mechanical interface necessary. The switch is not only compact, but is designed as an 8-way opto-electric device using substantial materials and solid state components.

The primary object of the invention is the longevity of the switch, as there are no moving parts to wear out since no parts touch, rub, or create friction and the switch action optically triggers electronic circuits and uses no electrical contacts.

Another object of the invention may be directed to the force required to actuate the switch. While the application dictates the requirements, the material, diameter and shape of the shaft may easily be selected to obtain the optimum force. As an example, heavy industrial equipment may prefer a stiff force to actuate the switch while delicate robotics would function better with a light force even to a light touch of ones tongue in the case of a totally disabled person, such as a quadriplegic.

A further object of the invention is in the simplicity of design, as few parts are employed to start with, and each part is fundamental and easy to manufacture, making the entire switch efficient and cost effective.

These and other objects and advantages of the present invention will become apparent from the subsequent detailed description of the preferred embodiment and the appended claims taken in conjunction with the accompanying drawings.

BRIEF DESCRIPTION OF THE DRAWINGS

FIG. 1 is a partial isometric view of the preferred embodiment.

FIG. 2 is a diagram of the switch action with numerals 1 through 8 illustrating switch position at 45 degree increments and alpha symbols a through d indicating the axes for the location of the optical devices.

FIG. 3 is a cross-sectional view of the invention taken along 3—3 of FIG. 1 with the output signal wires partially extending beyond the housing rotated 180 degrees for clarity.

BEST MODE FOR CARRYING OUT THE INVENTION

Figure 4:
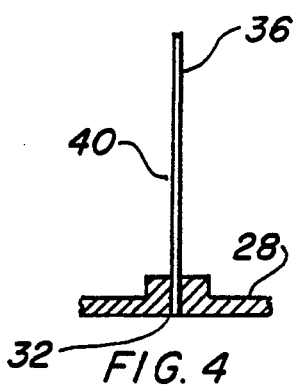
FIG. 4 is a partial view of the shaft in the constant diameter embodiment.

The best mode for carrying out the invention is presented in terms of a preferred embodiment with slight variations in the configuration of the shaft and the location of the control logic. The preferred embodiment, as shown in FIGS. 1 through 10, is comprised of a housing 20 that is made of two separate pieces attached together with fastening means, such as screws 22. The housing 20 consists of a top 24 in flange shape with an extended collar 26 having an opening in the center. The collar 26 is preferably threaded for attachment with a nut similar to a conventional toggle switch. The other piece of the housing 20 is a bottom 28 having a cavity 30 inside. This bottom portion 28 is preferably in a hollow cylindrical shape with a hole 32 in the bottom and two stepped registers 34 near the top on the inside. Mating clearance and threaded holes are located within the top 24 and bottom 28 for attachment with the screws 22 completing the housing assembly.

Figure 5:
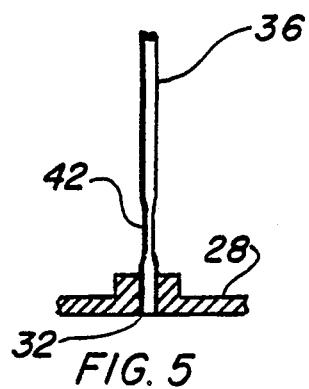
FIG. 5 is a partial view of the shaft in the reduced diametrical embodiment.
Figure 6:
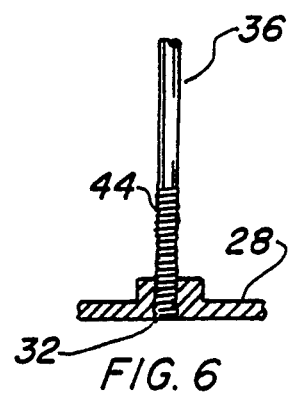
FIG. 6 is a partial view of the shaft in the integral spring embodiment.
Figure 8:
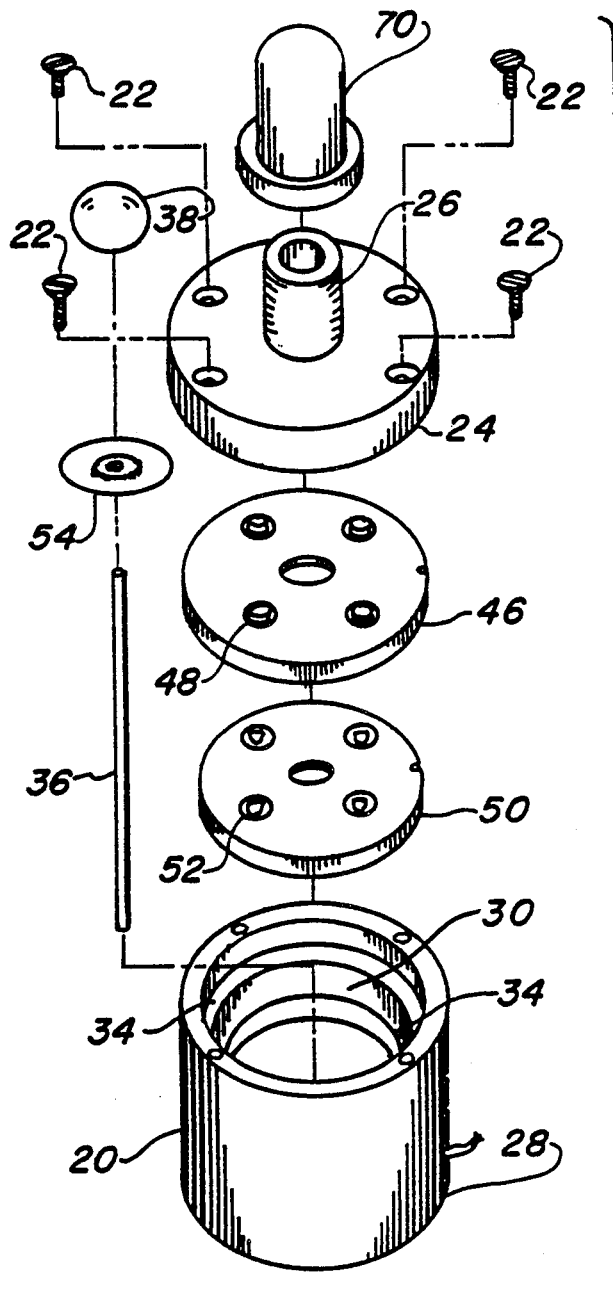
FIG. 8 is an exploded view of the invention.
Figure 7:
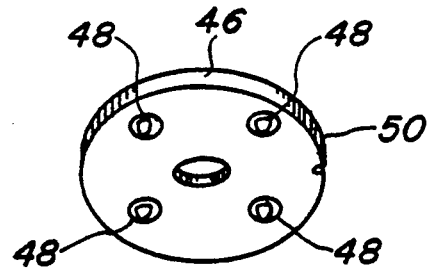
FIG. 7 is a partial isometric view of the second printed circuit board having signal circuit means removed from the assembly for clarity.

A resilient joystick shaft 36 is rigidly mounted by a press fit into the hole 32 inside the cavity 30 of the housing bottom 28. This shaft 36 extends beyond the housing top 24 centrally through the opening in the collar 26. The shaft 36, being resilient, bends within the limits of the opening in the collar 26 as it is held firmly on the bottom end by the hole 32. The resiliency of the shaft 36 allows it to return to a neutral or center position when an external force, such as manually pushing to one side or the other, is removed. A knob 38 is positioned on the extended end of the shaft 36 for ease of handling and manipulation. The shaft may be in one of three embodiments illustrated in FIGS. 4 through 6. The first embodiment, depicted in FIG. 4, also assembled in FIGS. 3 and 8, consists of a round rod 40 made of beryllium copper alloy, preferably heat treated to an optimum hardness of a diameter that allows flexure but will always spring back to the neutral position. The second embodiment is shown in FIG. 5 and is similar to the first, except a section near the mounted end is reduced in diameter 42 controlling the flexural resistance or actuation force, while allowing the balance of the shaft to remain straight. The third embodiment, illustrated in FIG. 6, consists of a shaft 40 and an integral spring 44. The shaft 40 is pressed into the spring 44 and the spring is pressed into the hole 32 in the housing 28. The spring 44 bends allowing the shaft to remain straight throughout its angular travel.

A first printed circuit board 46 is removably attached within the upper step register 34 in the housing 28. This printed circuit board 46 contains a plurality, preferably four, infrared light emitting diodes 48 providing the light source for the switch. The board 46 is circular in shape with preferably a small notch in one side allowing a set screw or some other hardware to assure the requisite alignment.

A second printed circuit board 50 is also removably attached within the lower step register 34 in the housing 28. This printed circuit board 50 contains a plurality of light detecting photodiodes 52 in direct alignment and facing the light emitting diodes 48 providing a light sensing source for the switch. This board 50 is aligned in the same manner as above. The distance between the light emitting diode 48 and photodiode 52 is sufficiently close to allow optimum sensing of the light path.

A light blocking commutator disc 54 is disposed on the joystick shaft 36 between the first and second printed circuit boards 46 and 50 such that when the shaft is manually forced a given direction, the light passing from an adjacent light emitting diode 48 to a mating photodiode 52 is blocked interrupting the light path. The disc 54 is of a diameter of sufficient size in relation to the positions of the diodes 48 and 52 to block two adjacent diodes when the shaft 36 is tilted midway therebetween. The relationship between the disc and the diodes 48 and 52 is pictorially illustrated in FIG. 2 with numerals 1 through 8 indicating the joystick location at 45 degree increments and the a through d alpha symbols indicating the diode location. The phantom line illustrates the disc 54 being pushed in a particular angular direction covering two sets of diodes at the same time creating 8 positions for the switch.

The following matrix illustrates this condition rotating the joystick clockwise 360 degrees.

| Position | Diodes blocked (Contacts closed) |
| --- | --- |
| 1 | a |
| 2 | a & b |
| 3 | b |
| 4 | b & c |
| 5 | c |
| 6 | c & d |
| 7 | d |
| 8 | d & a |

It will be noted that while the location of the joystick is critical to the switch action with this position accurately repeatable as the diodes 48 and 52 are stationary and the disc 54 is precisely round and unchanged in its configuration during operation.

Signal circuit means are operatively associated with each set of diodes 48 and 52 in the form of traces on the printed circuit boards 46 and 50 and wires interconnecting therebetween. This allows an electrical signal from an external source to be broken when the disc 54 interrupts the light path between diodes 48 and 52. These wires may extend beyond the housing 20 for use by others in conjunction with operating equipment or apparatus wherein the electronics are included externally and only the light sensing devices are required within the switch.

Figure 9:
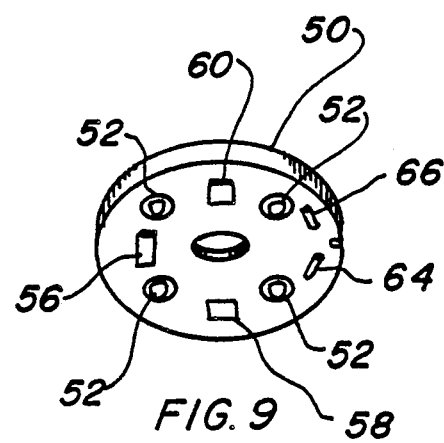
FIG. 9 is a partial isometric view of the second printed circuit board having signal circuit means and integral signal processing means removed from the assembly for clarity.

A further refinement of the invention includes signal processing means included with the switch itself, either internally mounted on the circuit boards 46 and 50, as illustrated in FIG. 9, or external to the switch in a separate enclosure. Since a separate enclosure is old and well known in the art and any suitable configuration is acceptable, this embodiment is, therefore, not illustrated in the drawings.

The signal processing means are also well known in the art of electronics and are included in the enabling embodiment as a best mode combination, however, many other schemes may function with equal ease, therefore, the invention is not limited to this particular arrangement.

Figure 10:
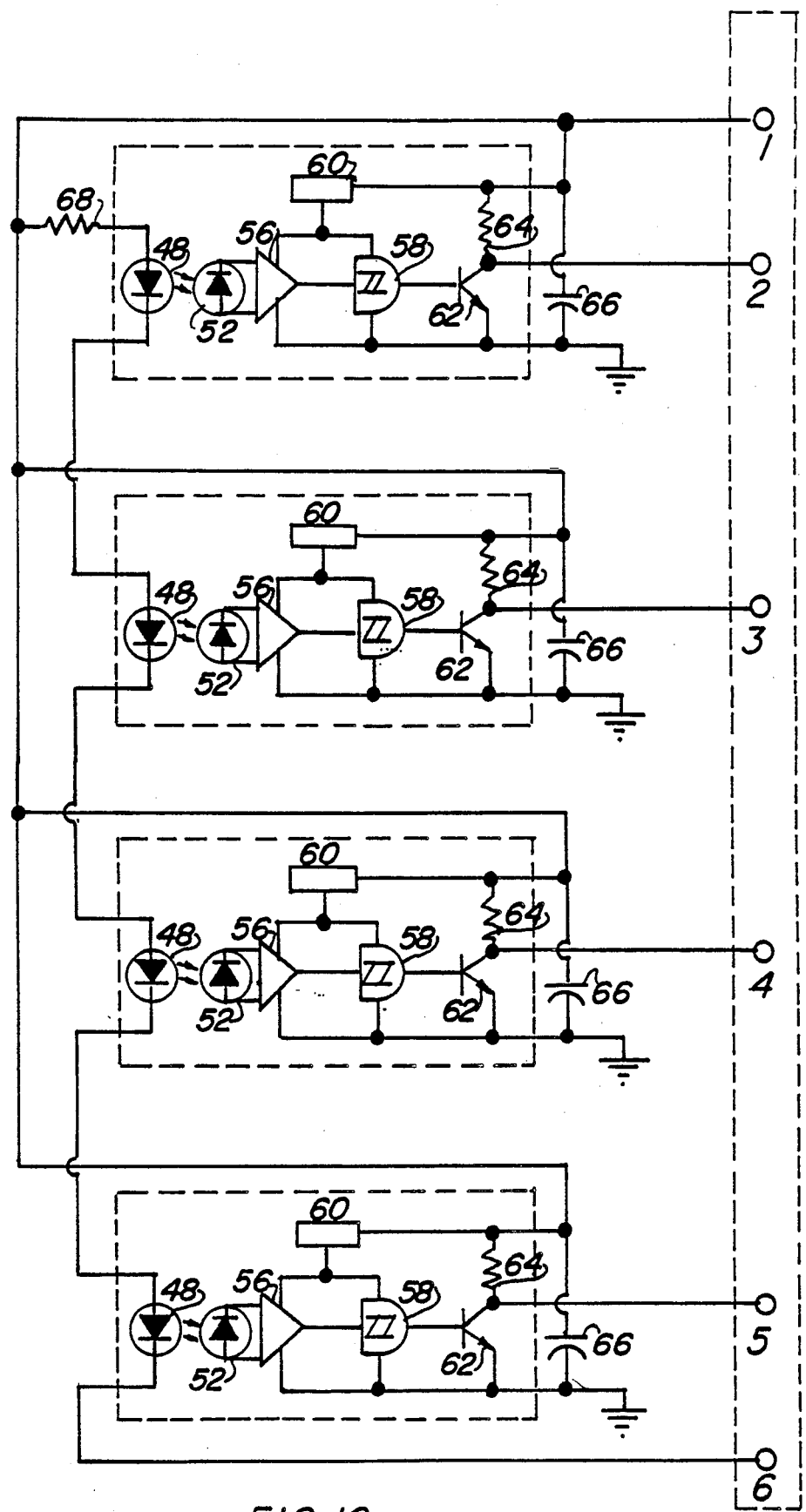
FIG. 10 is an electrical schematic of a typical signal processing means.

In any event, the schematic is shown in FIG. 10 and includes an amplifier 56 connected across the photodiode 52 and to a Schmitt-trigger 58 having its output connected to the output of the amplifier 56, a voltage regulator 60 connects between external supply input voltage designated terminal 1 on FIG. 10, such as +5 volts to inputs of amplifier 56 and Schmitt-trigger 58. A transistor 62 has its base connected to the output of the Schmitt-trigger 58 and its emitter connected to ground with a bias resistor 64 connected between the collector and terminal 1. In operation when the light to the photodiode 52 from the light emitting diode 48 is interrupted, a voltage produced at the output of the amplifier causes the Schmitt-trigger 58 to produce a pulse at its output which energizes the transistor 62 causing the output terminal on the transistor 62 to change from high voltage to nil. A bypass capacitor 66 connected between the input power and ground for voltage stabilization. Further, a resistor 68 is connected between the input power and a series circuit of the light emitting diodes 48 to limit the current flow.

In order to complete the assembly for weathertight applications, a resilient waterproof boot 70 may be added that covers the joystick shaft 36 and knob 38. As the wires leaving the switch may be potted or otherwise sealed at their interface with the housing 20, the entire switch may be sealed tightly, particularly when the housing top 24 is held tightly against the housing bottom 28 with screws 22 illustrated in FIGS. 1, 3 and 8.

While the invention has been described in complete detail and pictorially shown in the accompanying drawings, it is not to be limited to such details, since many changes and modifications may be in the invention without departing from the spirit and the scope thereof. For example, a gradual blocking of the light path will allow a linear output to be obtained for applications requiring a linear (analog) output as opposed to a digital output. Also, in lieu of a photodiode, a phototransistor or a photovoltaic cell can be used. Hence, it is described to cover any and all modifications and forms which may come within the language and scope of the claims.

We claim:

1. An opto-electrical joystick switch adapted for connection with electronic apparatus responsive to change in electrical state comprising:
   (a) a housing having a separable top and bottom with an opening in the top and a cavity in the bottom;
   (b) a resilient joystick shaft rigidly mounted within the cavity of the bottom portion of the housing extending beyond the housing top centrally through the opening thereof having the functional characteristics of returning to a center neutral position when manual external forces causing bending of the shaft are removed;
   (c) a first printed circuit board having a plurality of light emitting diodes therein removably attached within an upper portion of the bottom housing cavity providing a light source for the switch;
   (d) a second printed circuit board having a plurality of light detecting photodiode removably attached within a central portion of the bottom housing cavity with the photodiodes in direct alignment with the light emitting diodes providing a light sensing source for the switch;
   (e) a light blocking commutator disc disposed upon said shaft between the first and second printed circuit boards such that when the shaft is manually forced in a given direction, the light passing from an adjacent light emitting diode to a corresponding photodiode is blocked, interrupting communication therebetween; and,
   (f) signal circuit means operatively associated with each opposed light emitting diodes and photodiodes creating a defined circuit flowpath relative to the position the joystick shaft, creating a make or break correlation allowing a change in electrical characteristics defining a switch action;

2. The joystick switch as recited in claim 1 wherein said top housing further comprises an extended collar elongating the opening with the collar having threads for attachment with a nut for mounting in a switch like manner.

3. The joystick switch as recited in claim 1 wherein said resilient joystick shaft further comprises a knob attached on the end extending beyond the housing top for manual manipulation thereof.

4. The joystick switch as recited in claim 1 wherein said joystick shaft is made of beryllium copper alloy to provide repeatable shaft flexure.

5. The joystick switch as recited in claim 4 wherein said beryllium copper shaft is heat treated to s specific hardness optimizing the spring like characteristics of the metal.

6. The joystick switch as recited in claim 1 wherein said joystick shaft contains a reduced diametrical section between the end mounted within the housing cavity and the commutator disc for controlling the flexural resistance of the shaft relative to the manual force required to bend the shaft.

7. The joystick switch as recited in claim 1 wherein said joystick shaft further comprises a spring integrally disposed between the end mounted within the housing cavity and the commutator disc for controlling the flexural resistance of the shaft relative to the manual force required to bend the shaft.

8. The joystick switch as recited in claim 1 wherein said light blocking commutator disc further comprises a diameter of sufficient size in relation to the positions of said light emitting diodes and photodiodes to block light to two adjacent diodes when the shaft is tilted in a position midway therebetween.

9. The joystick switch as recited in claim 1 wherein said signal circuit means further comprise the combination of traces on said circuit boards and wires interconnecting between circuit boards creating an internal circuit for the switch.

10. The joystick switch as recited in claim 9 further comprising external leads connected to said signal circuit means extending beyond the housing for connection to external processes.

11. The joystick as recited in claim 9 further comprising signal processing means having:
   (a) a plurality of amplifiers connected across the output of each light emitting diode and photodiode combination;
   (b) a plurality of Schmitt-triggers connected to the output of each diode;
   (c) a transistor connected to the output of each Schmitt-trigger; and,
   (d) a voltage regulator supplying the correct level of voltage to said amplifier and said Schmitt-trigger, said signal processing means producing a make or break circuit with the transistor forming a solid state switch.

12. The joystick switch as recited in claim 11 wherein said signal processing means is integral with said first and second printed circuit boards and signal circuit means and further comprising external leads connected to said signal processing means extending beyond the housing for external connection.

13. The joystick switch as recited in claim 11 wherein said signal processing means is external to said switch and further comprising external leads connected to said signal circuit means extending beyond the housing for external connection.

14. The joystick switch as recited in claim 1 further comprising a resilient weatherproof boot covering the joystick shaft, interfacing over the top housing completely enclosing the switch from the outside environment.

15. An opto-electrical joystick switch adapted for connection with electronic apparatus responsive to change in electrical state comprising:
- (a) a housing having a separable top and bottom with an opening and an extended collar in the top and a stepped cavity in the bottom;
- (b) a resilient joystick shaft of heat treated beryllium copper having a knob, the shaft rigidly mounted within the cavity of the bottom portion of the housing extending beyond the housing top centrally through the opening thereof, having the functional characteristics of returning to a center neutral position when manual external forces causing bending of the shaft are removed;
- (c) a first printed circuit board having a plurality of light emitting diodes therein removably attached within an upper portion of the bottom housing cavity providing a light source for the switch;
- (d) a second printed circuit board having a plurality of light detecting photodiode removably attached within a central portion of the bottom housing having cavity with the photodiodes in direct alignment with the light emitting diodes providing a light sensing source for the switch;
- (e) a light blocking commutator disc disposed upon said shaft between the first and second printed circuit boards such that when the shaft is manually forced a given direction, the light passing from an adjacent light emitting diode to a mating photodiode is blocked interrupting communication therebetween, the disc having a diameter of sufficient size in relation to the positions of said light emitting diodes and photodiodes to block light to two adjacent diodes when the shaft is tilted in a position midway therebetween; and,
- (f) signal circuit means operatively associated with each opposed light emitting diodes and photodiodes creating a defined circuit flowpath relative to the position of the joystick shaft, creating a make or break correlation allowing a change in electrical characteristics defining a switch action.

* * * * *